(12) United States Patent
Curatola et al.

(10) Patent No.: US 10,840,353 B2
(45) Date of Patent: Nov. 17, 2020

(54) HIGH ELECTRON MOBILITY TRANSISTOR WITH DUAL THICKNESS BARRIER LAYER

(71) Applicant: Infineon Technologies Austria AG, Villach (AT)

(72) Inventors: Gilberto Curatola, Villach (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/714,868

(22) Filed: Dec. 16, 2019

(65) Prior Publication Data

US 2020/0119162 A1 Apr. 16, 2020

Related U.S. Application Data

(62) Division of application No. 15/913,068, filed on Mar. 6, 2018, now Pat. No. 10,541,313.

(51) Int. Cl.
*H01L 29/66* (2006.01)
*H01L 29/06* (2006.01)
(Continued)

(52) U.S. Cl.
CPC .... *H01L 29/66462* (2013.01); *H01L 29/0657* (2013.01); *H01L 29/0692* (2013.01);
(Continued)

(58) Field of Classification Search
CPC ........... H01L 29/66462; H01L 29/0657; H01L 29/0692; H01L 29/1066; H01L 29/2003; H01L 29/41766; H01L 29/7783
(Continued)

(56) References Cited

U.S. PATENT DOCUMENTS 7,271,429 B2 9/2007 Saito et al.
9,231,057 B2 * 1/2016 Jeon ...................... H01L 29/861
(Continued)

OTHER PUBLICATIONS

Curatola, Gilberto, "High Electron Mobility Transistor with Graded Back-Barrier Region", U.S. Appl. No. 15/352,115, filed Nov. 15, 2016, 1-26.
(Continued)

*Primary Examiner* — Igwe U Anya
(74) *Attorney, Agent, or Firm* — Murphy, Bilak & Homiller, PLLC

(57) ABSTRACT

A semiconductor device includes a heterojunction semiconductor body including a first and second type III-V semiconductor layers with different bandgaps such that a first two-dimensional charge carrier gas forms at an interface between the two layers. The second type III-V semiconductor layer includes a thicker section and a thinner section. A first input-output electrode is on the thicker section and is in ohmic contact with the first two-dimensional charge carrier gas. A second input-output electrode is formed on the thinner section and is in ohmic contact with the first two-dimensional charge carrier gas. A gate structure is formed on the thinner section and is configured to control a conductive connection between the first and second input-output electrodes. The gate structure is laterally spaced apart from a transition between the thicker and thinner sections of the second type III-V semiconductor layer.

7 Claims, 14 Drawing Sheets

(51) Int. Cl.
*H01L 29/417* (2006.01)
*H01L 29/778* (2006.01)
*H01L 29/20* (2006.01)
*H01L 29/10* (2006.01)

(52) U.S. Cl.
CPC ...... *H01L 29/1066* (2013.01); *H01L 29/2003* (2013.01); *H01L 29/41766* (2013.01); *H01L 29/7783* (2013.01); *H01L 29/0619* (2013.01)

(58) Field of Classification Search
USPC .......................................................... 257/194
See application file for complete search history.

(56) References Cited

U.S. PATENT DOCUMENTS

| | | | |
|---|---|---|---|
| 9,269,790 B2* | 2/2016 | Lee | H01L 29/7787 |
| 2002/0017648 A1 | 2/2002 | Kasahara et al. | |
| 2002/0185655 A1 | 12/2002 | Fahimulla et al. | |
| 2005/0189559 A1 | 9/2005 | Saito et al. | |
| 2007/0045670 A1 | 3/2007 | Kuraguchi | |
| 2009/0146185 A1 | 6/2009 | Suh et al. | |
| 2009/0315075 A1 | 12/2009 | Sato | |
| 2011/0210377 A1 | 9/2011 | Haeberlen et al. | |
| 2013/0075790 A1 | 3/2013 | Hirler et al. | |
| 2013/0248874 A1 | 9/2013 | Kuraguchi | |
| 2013/0313560 A1 | 11/2013 | Khalil et al. | |
| 2013/0313561 A1 | 11/2013 | Suh | |
| 2014/0021480 A1 | 1/2014 | Jeon | |
| 2014/0097468 A1 | 4/2014 | Okita et al. | |
| 2015/0076508 A1 | 3/2015 | Saito et al. | |
| 2015/0236103 A1 | 8/2015 | Kuraguchi | |
| 2015/0318387 A1 | 11/2015 | Chiu et al. | |
| 2016/0049347 A1 | 2/2016 | Negoro et al. | |
| 2017/0125572 A1* | 5/2017 | Curatola | H01L 29/1066 |
| 2017/0271495 A1 | 9/2017 | Yoshioka et al. | |
| 2017/0365701 A1 | 12/2017 | Kim et al. | |
| 2018/0012960 A1 | 1/2018 | Kinoshita et al. | |
| 2019/0096877 A1 | 3/2019 | Kudymov et al. | |

OTHER PUBLICATIONS

Kachi, Tetsu, et al., "GaN Power Device and Reliability for Automotive Applications", 2012 IEEE International Reliability Physics Symposium (IRPS), Apr. 15-19, 2012, 1-4.

Okita, Hideyuki, et al., "Through Recess and Regrowth Gate Technology for Realizing Process Stability of GaN-Based Gate Injection Transistors", IEEE Transactions on Electron Devices, vol. 64, No. 3, Mar. 2017, 1026-1031.

* cited by examiner

HIGH ELECTRON MOBILITY TRANSISTOR WITH DUAL THICKNESS BARRIER LAYER

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises near the interface between the AlGaN barrier layer and the GaN channel layer. In an HEMT, the 2DEG forms the channel of the device. Similar principles may be utilized to select channel and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

Due to the high electron mobility of the Iwo-dimensional carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example.

Designers are constantly seeking ways to improve the performance of HEMTs, e.g., power consumption and voltage blocking capability. Exemplary device parameters that designers focus on to improve HEMT performance include leakage current, threshold voltage ($V_{TH}$), drain-source on-state resistance ($R_{DSON}$), and maximum voltage switching capability, to name a few.

SUMMARY

A method of forming a semiconductor device is disclosed. According to an embodiment, the method includes providing a heterojunction semiconductor body. The heterojunction semiconductor body includes a first type III-V semiconductor layer and a second type III-V semiconductor layer formed over the first type III-V semiconductor layer. The second type III-V semiconductor layer has a different bandgap as the first type III-V semiconductor layer such that a first two-dimensional charge carrier gas forms at an interface between the first and second type III-V semiconductor layers. The heterojunction semiconductor body is provided such that the second type III-V semiconductor layer has a thicker section and a thinner section. A first input-output electrode is formed on the thicker section of the second type III-V semiconductor layer, the first input-output electrode being in ohmic contact with the first two-dimensional charge carrier gas. A second input-output electrode is formed on the thinner section of the second type III-V semiconductor layer, the second input-output electrode being in ohmic contact with the first two-dimensional charge carrier gas. A gate structure is formed on the thinner section of the second type III-V semiconductor layer, the gate structure being configured to control a conductive connection between the first and second input-output electrodes. The gate structure is laterally spaced apart from a transition between the thicker and thinner sections of the second type III-V semiconductor layer.

According to another embodiment, the method includes providing a heterojunction semiconductor body. The heterojunction semiconductor body includes a first type III-V semiconductor layer and a second type III-V semiconductor layer formed over the first type III-V semiconductor layer. The second type III-V semiconductor layer has a different bandgap as the first type III-V semiconductor layer such that a first two-dimensional charge carrier gas forms at an interface between the first and second type III-V semiconductor layers. The heterojunction semiconductor body is provided such that the second type III-V semiconductor layer has a thicker section and a thinner section. A first input-output electrode is formed on the thicker section of the second type III-V semiconductor layer, the first input-output electrode being in ohmic contact with the first two-dimensional charge carrier gas. A second input-output electrode is formed on the thinner section of the second type III-V semiconductor layer, the second input-output electrode being in ohmic contact with the first two-dimensional charge carrier gas. A gate structure is formed on the thinner section of the second type III-V semiconductor layer, the gate structure being configured to control a conductive connection between the first and second input-output electrodes. The gate structure is disposed completely above a first planar upper surface of the second type III-V semiconductor layer, the first planar upper surface extending out from underneath the gate structure at either side of the gate structure.

A semiconductor device is disclosed. According to an embodiment, the semiconductor device includes a heterojunction semiconductor body. The heterojunction semiconductor body includes a first type III-V semiconductor layer and a second type III-V semiconductor layer formed over the first type III-V semiconductor layer. The second type III-V semiconductor layer has a different bandgap as the first type III-V semiconductor layer such that a first two-dimensional charge carrier gas forms at an interface between the first and second type III-V semiconductor layers. The second type III-V semiconductor layer includes a thicker section and a thinner section. A first input-output electrode is formed on the thicker section of the second type III-V semiconductor layer, the first input-output electrode being in ohmic contact with the first two-dimensional charge carrier gas. A second input-output electrode is formed on the thinner section of the second type III-V semiconductor layer, the second input-output electrode being in ohmic contact with the first two-dimensional charge carrier gas. A gate structure is formed on the thinner section of the second type III-V semiconductor layer, the gate structure being configured to control a conductive connection between the first and second input-output electrodes. The gate structure is laterally spaced apart from a transition between the thicker and thinner sections of the second type III-V semiconductor layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

A high-electron-mobility Field Effect Transistor (HEMT) is described herein. According to embodiments, the barrier layer of the device includes a thicker region and a thinner region. In one embodiment, the barrier layer has a planar upper surface in both the thicker and thinner regions, and a step-shaped transition between the thicker and thinner regions. The gate and source electrodes are provided on the thinner section while the drain electrode is provided on the thicker section. Because the gate is provided on the thinner region of the barrier layer, the two-dimensional charge carrier gas that is underneath the gate has a relatively lower carrier density in comparison to the two-dimensional charge carrier gas underneath the thicker section of the barrier layer. This reduction in carrier density advantageously enables higher threshold voltage ($V_{TH}$) and hardens the gate against high switching voltages. Meanwhile, these benefits are obtained without substantial detrimental impact to drain-source on-state resistance ($R_{DSON}$) because the drift region of the device has a higher carrier density, due to the provision of a thicker barrier region in the drift region of the device, i.e., between the gate and drain.

A method of forming a HEMT is described herein. According to embodiments, the method includes a using a masked etching technique to form the barrier layer of the device with a thicker and thinner region. This technique advantageously offers precise control of the physical dimensions of the barrier layer and therefore offers precise control over the performance parameters of the HEMT. In one advantageous process step, the gate structure, a deep contact structure, and a drain-biasing structure of the HEMT are formed at the same time using a common lithography process that utilizes a single layer of p-type material and a single layer of conductive material.

Figure 1:
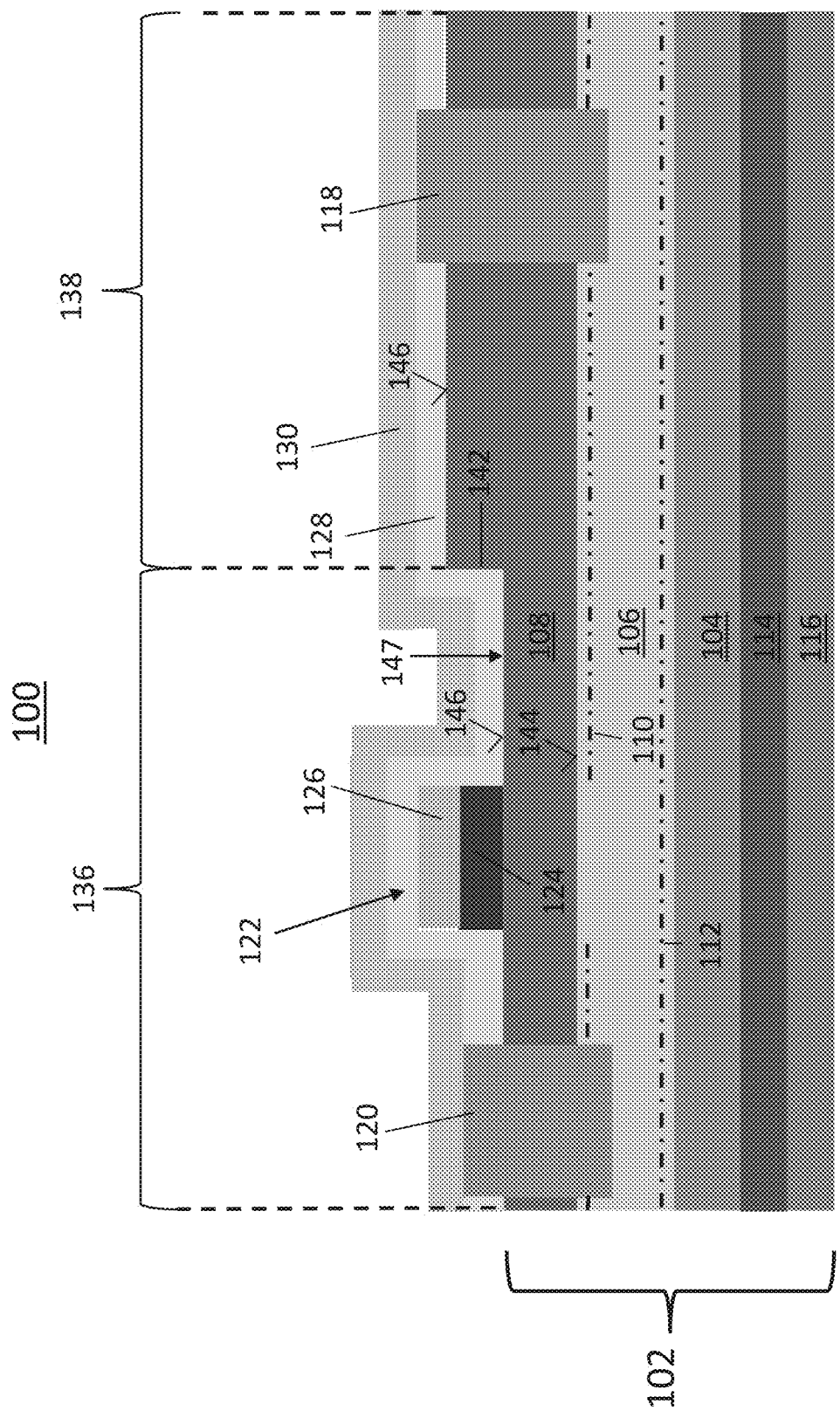
FIG. 1 illustrates a semiconductor device with a multi-thickness barrier layer, according to an embodiment.

Referring to FIG. 1, a semiconductor device 100 is depicted, according to an embodiment. The semiconductor device 100 includes a heterojunction semiconductor body 102. The heterojunction semiconductor body 102 includes a back-barrier region 104, a channel layer 106 formed on the back-barrier region 104, and a barrier layer 108 formed on the channel layer 106. The barrier layer 108 has a different bandgap as the channel layer 106. Due to this difference in bandgap, a first two-dimensional charge carrier gas 110 intrinsically arises near the interface between the channel layer 106 and the barrier layer 108. In addition, the material of the back-barrier region 104 has a different bandgap as the material of the channel layer 106. Due to this difference in bandgap, a second two-dimensional charge carrier gas 112 intrinsically arises near the interface between the channel layer 106 and the back-barrier region 104. The second two-dimensional charge carrier gas 112 has an opposite majority carrier type as the first two-dimensional charge carrier gas 110. For example, in the case that the first two-dimensional charge carrier gas 110 is a two-dimensional electron gas (2DEG), the second two-dimensional charge carrier gas 112 is a two-dimensional hole gas (2DHG), and vice-versa.

Generally speaking, the channel and barrier layers 106, 108 can be formed from any semiconductor material in which the bandgaps can be manipulated to form the first two-dimensional charge carrier gas 110. Examples of this material includes type III-V semiconductor material (e.g., gallium nitride, gallium arsenide, etc.), wherein a metallic element (e.g., aluminum, indium, etc.) is introduced into the material to adjust the bandgap. The material properties of the back-barrier region 104 (e.g., thickness, bandgap, etc.) are selected to increase carrier confinement in the first two-dimensional charge carrier gas 110 and to prevent device leakage through the lower regions of the heterojunction semiconductor body 102.

The heterojunction semiconductor body 102 additionally includes a transition region 114 and a base substrate 116. The transition region 114 is formed on the base substrate 116, and the back-barrier region 104 is formed on the transition region 114. The base substrate 116 includes a semiconductor material that is suitable for epitaxial growth techniques, e.g., silicon, carbon, silicon carbide, sapphire, etc. The transition region 114 is a so-called lattice transition region 114 that is configured to alleviate mechanical stress that is attributable to crystalline lattice mismatch between type IV semiconductor material of the base substrate 116 (e.g., silicon) and the type III-V semiconductor material of the channel and barrier layers 106, 108. The transition region 114 may include type III-V semiconductor material, metal layers, and electrical insulators, for example. Moreover, the metallic concentration of the transition region 114 may be varied in a way that alleviates mechanical stress, e.g., with a metallic concentration that decreases moving away from the base substrate 116.

According to an embodiment, the heterojunction semiconductor body 102 is a Gallium Nitride (GaN) based semiconductor body. In this embodiment, the base substrate 116 is provided from a commercially available bulk wafer, such as a silicon wafer Further, in this embodiment, the transition region 114 includes aluminum gallium nitride (AlGaN) with a gradually diminishing aluminum content moving away from the base substrate 116. Alternatively, the transition region 114 can include aluminum nitride (AlN) layers periodically interposed between multiple GaN layers or GaN based layers. Further, in this embodiment, the back-barrier egion 104 can be a region of aluminum gallium nitride (AlGaN) with a uniform aluminum content (within process capability) of between two and ten percent, for example throughout the entire back-barrier region 104. Alternatively, the back-barrier region 104 can be graded back-barrier region, e.g., as described in U.S. application Ser. No. 15/352,115 to Curatola. According to this design, the back-barrier region 104 includes a first back-barrier region directly beneath the channel layer 106, and a second back-barrier region beneath the first back-barrier region. The first and second back-barrier regions are each regions of type III-V semiconductor material having different bandgaps from one another. For example, the first back-barrier region can be a first layer of AlGaN and the second back-barrier region can be a second layer of AlGaN wherein the aluminum content is higher than in the first back-barrier region. An intentionally doped region of AlGaN (e.g., a carbon doped AlGaN region) can be provided beneath the second back-barrier region 104. Further, in this embodiment, the channel layer 106 can be an intrinsic layer of pure or essentially pure GaN. Alternatively, the channel layer 106 can include AlGaN with a very low Al content (e.g., less than 10%) and, in addition or in the alternative, may include dopant atoms such as (e.g., carbon or iron). Further, in this embodiment, the barrier layer 108 can be a layer of AlGaN with a higher Al content than the channel layer 106 (e.g., greater than 10%, 15%, 20%, etc.).

The semiconductor device 100 additionally includes a first electrically conductive input-output electrode 118 and a second electrically conductive input-output electrode 120. The first and second input-output electrodes 118, 120 are both formed over the barrier layer 108. The first and second input-output electrodes 118, 120 can include metals, e.g., nickel, copper, titanium, alloys thereof, metal nitrides, e.g., AlN, TiN, and highly doped semiconductors, e.g., polysilicon.

Both of the first and second input-output electrodes 118, 120 are in ohmic contact with the first two-dimensional charge carrier gas 110. This may be provided by direct physical contact between the first and second input-output electrodes 118, 120 and the first two-dimensional charge carrier gas 110, e.g., as depicted. However, direct physical contact between the first two-dimensional charge carrier gas 110 and the first and second input-output electrodes 118, 120 is not necessary, and the electrical connection can be provided with a variety of known techniques.

The semiconductor device 100 further includes a gate structure 122. The gate structure 122 is formed on the barrier layer 108 between the first and second input-output electrodes 118, 120. The gate structure 122 includes a second semiconductor region 124 formed on the on the upper surface of the barrier layer 108. The material properties of the second semiconductor region 124 (e.g., doping concentration, thickness, etc.) are selected such that the second semiconductor region 124 applies an electric field (in the absence of any external bias) to the first two-dimensional charge carrier gas 110 that locally depletes the first two-dimensional charge carrier gas 110 underneath the gate structure 122. According to an embodiment, the second semiconductor region 124 includes p-type GaN. The gate structure 122 further includes an electrically conductive gate electrode 126 formed on the doped semiconductor region 124. The gate electrode 126 can include metals, e.g., nickel, copper, titanium, alloys thereof, metal nitrides, e.g., AlN, TiN, and highly doped semiconductors, e.g., polysilicon.

The semiconductor device 100 further includes first and second passivation layers 128, 130 formed on the heterojunction semiconductor body 102. The first passivation layer 128 covers and may directly contact the channel layer 106 in the region between the gate structure 122 and the first input-output electrode 118, as well as in the region between the gate structure 122 and the second input-output electrode 120. The second passivation layer 130 covers and may conform to the upper side of the first passivation layer 128. Exemplary materials that are suitable for the first and second passivation layers 128, 130 include silicon nitride (SiN), silicon dioxide ($SiO_2$), and silicon oxynitride ($SiO_xN_y$), to name a few. According to an embodiment, the first and second passivation layers 128, 130 include $Si_3N_4$.

According to an embodiment, the semiconductor device 100 is configured as a high-electron mobility transistor, wherein the first input-output electrode 118 provides the drain of the device, the second input-output electrode 120 provides the source of the device, and the gate electrode 126 provides a voltage-controlled gate terminal that controls the electrical connection between the source and drain terminals of the device. The first two-dimensional charge carrier gas 110 acts as the channel of the device, and provides a conductive connection between the first and second input-output electrodes 118, 120. A control signal in the form of a voltage is applied to the gate electrode 126 to locally deplete (or repopulate) the first two-dimensional charge carrier gas 110 and consequently complete or disrupt the conductive connection between the first and second input-output electrodes 118, 120. Due to the provision of the second semiconductor region 124, the device is a configured as a so-called "normally-off" device. That is, a conductive connection between the first and second input-output electrode 118, 120 does not exist in the absence of a voltage applied to the gate electrode 126, and a sufficient voltage applied to the gate electrode 126 (i.e., the threshold voltage $V_{TH}$) repopulates the depleted region of the first two-dimensional charge carrier gas 110 and therefore completes the conductive connection between the first and second input-output electrodes 118, 120.

The barrier layer 108 includes a thinner section 136 and a thicker section 138. The thinner and thicker sections 136, 138 of the barrier layer 108 are laterally adjacent to one another, with a transition 142 provided between the thicker and thinner sections 136, 138. The thinner section 136 has a first thickness and the thicker section 138 has a second thickness that is greater than the first thickness. The thicknesses of the thinner and thicker sections 136, 138 are measured between a lower surface 144 of the barrier layer 108 that faces the channel layer 106 and an upper surface 146 of the barrier layer 108 that is opposite from the lower surface 144. Exemplary thickness values for the second thickness (i.e., the thickness of the thinner section 136) can be in the range of 10-20 nanometers, for example. Exemplary thickness values for the second thickness (i.e., the thickness of the thicker section 138) can be in the range of 20-50 nanometers, for example. The difference between the thinner section 136 and thicker sections 138 (i.e., the depth of the recess formed by the thinner section 136) can be in the range of 5-10 nanometers, for example.

According to an embodiment, one or both of the thinner and thicker sections 136, 138 have a substantially uniform thickness along the entire lateral span of these regions. That is, the upper surface 146 of the barrier layer 108 runs parallel to the lower surface 144 of the barrier layer 108 in one or both of the thinner and thicker sections 136, 138.

At the transition 142, the upper surface 146 of the barrier layer 108 is disposed at an oblique angle relative to the immediately adjoining upper surface 146 of the barrier layer 108 in the thinner sections 136. This oblique angle can be a perpendicular angle (i.e., as depicted) or, more generally, any oblique angle (e.g., 30 degrees, 45 degrees, 60 degrees, etc.).

The gate structure 122 is formed on the thinner section 136 of the barrier layer 108 at a location that is laterally spaced apart from the transition 142 between the thicker and thinner sections 136, 138. In addition, the second input-output electrode 120 is formed on the thinner section 136 of the barrier layer 108. The first input-output electrode 118 is formed on the thicker section 138 of the barrier layer 108, and may also be laterally spaced apart from the transition 142 between the thicker and thinner sections 136, 138. Thus, a portion of the thinner section 136 and a portion of the thicker section 138 are provided between the gate structure 122 and the first input-output electrode 118.

In the depicted embodiment, the gate structure 122 and the second input-output electrode 120 are formed on a first planar section 147 of the upper surface 146 of the barrier layer 108. The first planar section 147 of the upper surface 146 of the barrier layer 108 is parallel to the to the lower surface 144 of the barrier layer 108, and extends to the transition 142. Thus, the gate structure 122 and the second input-output electrode 120 are formed on a uniform thickness portion of the barrier layer 108. Moreover, the first planar section 147 of the upper surface 146 extends out from either side of the gate structure 122 such that thickness of the barrier layer 108 is the same directly underneath the gate structure 122 as on portions of the barrier layer 108 immediately adjoining the gate structure 122 on either side. That is, the gate structure 122 is completely above the first planar section 147 of the upper surface 146, and portions of the first planar section 147 of the upper surface 146 are exposed from the gate structure 122 on either side of the gate structure 122. By separating the gate structure 122 from the transition 142 between the thicker and thinner sections 136, 138, the gate structure 122 is spaced apart from damaging electric fields. In addition, the depicted geometry of the barrier layer 108 is easy to form using a lithography process, as it exceeds minimum widths of a lithography process.

Configuring the barrier layer 108 to include the thinner and thicker sections 136, 138 in the above described manner as well as the lateral positioning of the gate structure 122, the first input-output electrode 118, and the second input-output electrode 120 in the above described manner produces a device with advantageous properties.

One such advantage of the above described configuration is independent control of threshold voltage ($V_{TH}$) and drain-source on-state resistance ($R_{DSON}$). The threshold voltage ($V_{TH}$) of the device can be adjusted by appropriately tailoring the thickness of the barrier layer 108 underneath the gate electrode, i.e., by adjusting the thickness of the thinner section 136. A lower thickness reduces the carrier density of the first two-dimensional charge carrier gas 108 in the vicinity of the gate structure 122 and consequently increases the threshold voltage. Meanwhile, the drain-source on-state resistance ($R_{DSON}$) can be independently adjusted by adjusting the thickness of the barrier layer 108 in the drift region, i.e., i.e., by adjusting the thickness of the thicker section 138. A greater thickness increases the carrier density of the first two-dimensional charge carrier gas 108 and consequently increases the mobility of the channel in the region between the gate and drain of the device.

Another such advantage of the above described configuration is a ruggedized gate structure 122 that can withstand high electric fields. This is attributable to the provision of the gate structure 122 on the thinner portion of the barrier layer 108. Under large switching voltages, e.g., voltages between the first and second input-output electrodes 118, 120 of 400 V or more, the gate of the device, and in particular the edge side closest to the drain of the device, experiences large electric fields. These electric fields can be mitigated by reducing the inversion layer density of the channel that is directly beneath the gate-drain edge of the device. Accordingly, a lower thickness of the barrier layer 108, which reduces this inversion layer density, hardens the gate structure 122 against large electric fields.

Figure 2:
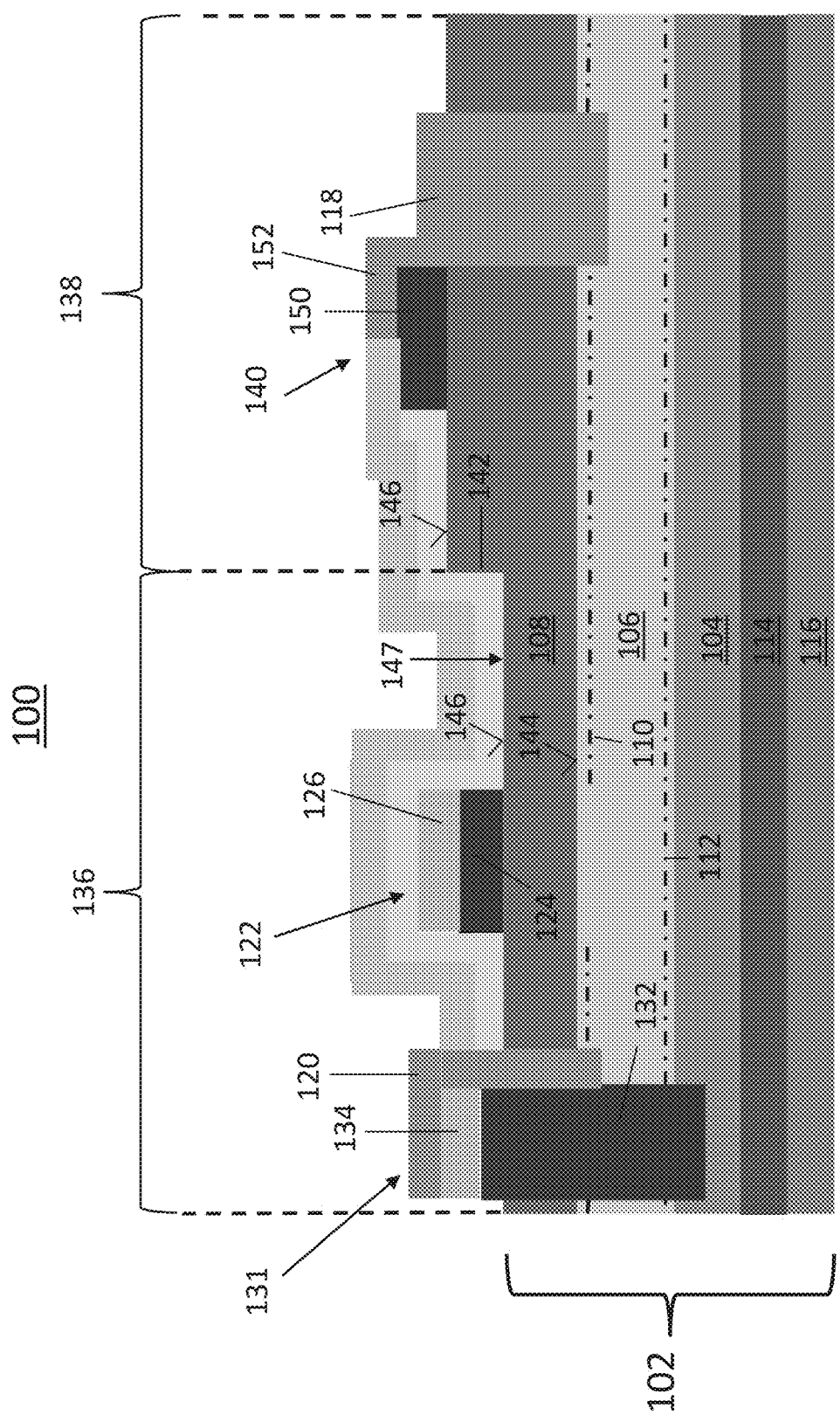
FIG. 2 illustrates a semiconductor device with a multi-thickness barrier layer, according to another embodiment.

Referring to FIG. 2, the semiconductor device 100 is depicted, according to another embodiment. The semiconductor device 100 of FIG. 2 is identical to the semiconductor device 100 described with reference to FIG. 1, with the following differences. First, the semiconductor device 100 of FIG. 2 additionally includes a deep contact structure 131. Second the semiconductor device 100 of FIG. 2 additionally includes drain biasing structure 140.

The deep contact structure 131 extends through the barrier and channel layers 108, 106 and may extend into the back-barrier region 104. Thus, the deep contact structure 131 directly interfaces with the second two-dimensional charge carrier gas 112. In the case that the back-barrier region 104 has more than one two-dimensional charge carrier gas, e.g., as described in U.S. application Ser. No. 15/352,115 to Curatola, the deep contact structure 131 can extend into the back-barrier region 104 to directly interface with each of these secondary two-dimensional charge carrier gases.

The deep contact structure 131 provides a conductive connection between the second two-dimensional charge carrier gas 112 and the second input-output electrode 120. Due to the electrical connection between the first contact material 132 and the second input-output electrode 120, a low resistance path is provided for the majority carriers present in the second two-dimensional charge carrier gas 112 to flow to and from the second input-output electrode 120. Thus, the potential of the second Iwo-dimensional charge carrier gas 112 is set to the potential of the second input-output electrode 120 by the deep contact structure 131.

The deep contact structure 131 includes a first contact material 132 that extends through the barrier layer 106 and the channel layer 108 and directly interfaces with the second two-dimensional charge carrier gas 112. The first contact material 132 is selected to permit holes from the second two-dimensional charge carrier gas 112 to easily traverse the interface between the first contact material 132 and the second two-dimensional charge carrier gas 112.

In one embodiment, the first contact material 132 includes doped semiconductor material, such as p-type GaN. This material can be appropriately doped to provide a low energy barrier (e.g., no greater than 0.2 eV) to the majority carriers of the two-dimensional charge carrier gas 112. This low energy barrier permits majority carriers of the two-dimensional charge carrier gas 112 to traverse (e.g., via thermionic emission) the interface between the channel layer 108 and the first contact material 132.

In another embodiment, the first contact material 132 includes an electrically conductive metal, such as tungsten, aluminum, copper, titanium, titanium nitride, etc., and alloys thereof. A non-rectifying junction between the second two-dimensional charge carrier gas 112 and the first contact material 132 can be achieved by selecting material that minimizes the barrier width and/or barrier height so that majority carriers of the two-dimensional charge carrier gas 112 can traverse the interface (e.g., via thermionic emission or tunneling effects).

The first contact material 132 of the deep contact structure 131 is electrically connected the second input-output electrode 120. In the depicted embodiment, the deep contact structure 131 further includes a first conductive region 134 that is formed on top of the first contact material 132 and directly contacts the second input-output electrode 120, thus providing the electrical connection between the deep contact structure 131 and the first contact material 132. The first conductive region 134 can include metals, e.g., aluminum, nickel, copper, titanium, alloys thereof, metal nitrides, e.g., AlN, TiN, and highly doped semiconductors, e.g., polysilicon. More generally, the first contact material 132 can be electrically connected to the second input-output electrode 120 in any conventionally known manner, and may optionally directly contact the second input-output electrode 120.

The drain biasing structure 140 is formed on the thicker section 138 of the barrier layer 108 between the transition 142 and the first input-output electrode 118. The drain biasing structure 140 includes a third semiconductor region 150 that is formed on the upper surface 146 of the barrier layer 108. The third semiconductor region 150 can include semiconductor material of the same type and doping concentration as the second semiconductor region 124 and the first contact material 132 (e.g., p-type GaN). The drain biasing structure 140 additionally includes an electrically conductive connection between the third semiconductor region 150 and the first input-output electrode 118. Thus, the third semiconductor region 150 is set to the same potential as the first input-output electrode 118 (e.g., the drain potential). In the depicted embodiment, the drain biasing structure 140 includes a third conductive region 152 that is formed on top of the third semiconductor region 150. The third conductive region 152 can include metals, e.g., aluminum, nickel, copper, titanium, alloys thereof, metal nitrides, e.g., AlN, TiN, and highly doped semiconductors, e.g., polysilicon. In the depicted embodiment, the third conductive region 152 is formed on a portion of the third semiconductor region 150 that is exposed from the first and second passivation layers 128, 130 and thus directly contacts the third semiconductor region 150. Thus, an electrical connection between the third semiconductor region 150 and the first input-output electrode 118 is provided by the third conductive region 152. More generally, the third semiconductor region 150 can be electrically connected to the first input-output electrode 118 in any conventionally known manner, and may optionally directly contact that first input-output electrode 118.

During operation of the semiconductor device 100, the drain biasing structure 140 injects holes into the barrier and channel layers 108, 106. In doing so, dynamic switching losses caused by charge traps and/or lattice defects are mitigated.

In another embodiment (not shown), the semiconductor device 100 includes the deep contact structure 131 as described with reference to FIG. 2 but does not include the drain biasing structure 140. In this embodiment, the deep contact structure 131 provides all of the benefits described herein.

Referring to FIGS. 3-8 selected process steps for forming the semiconductor device 100 are shown, according to an embodiment. These steps, in combination with conventionally known processing methods (not shown), can be used to form the semiconductor device 100 according to any one of the embodiments described with reference to FIGS. 1 and 2.

Figure 3:
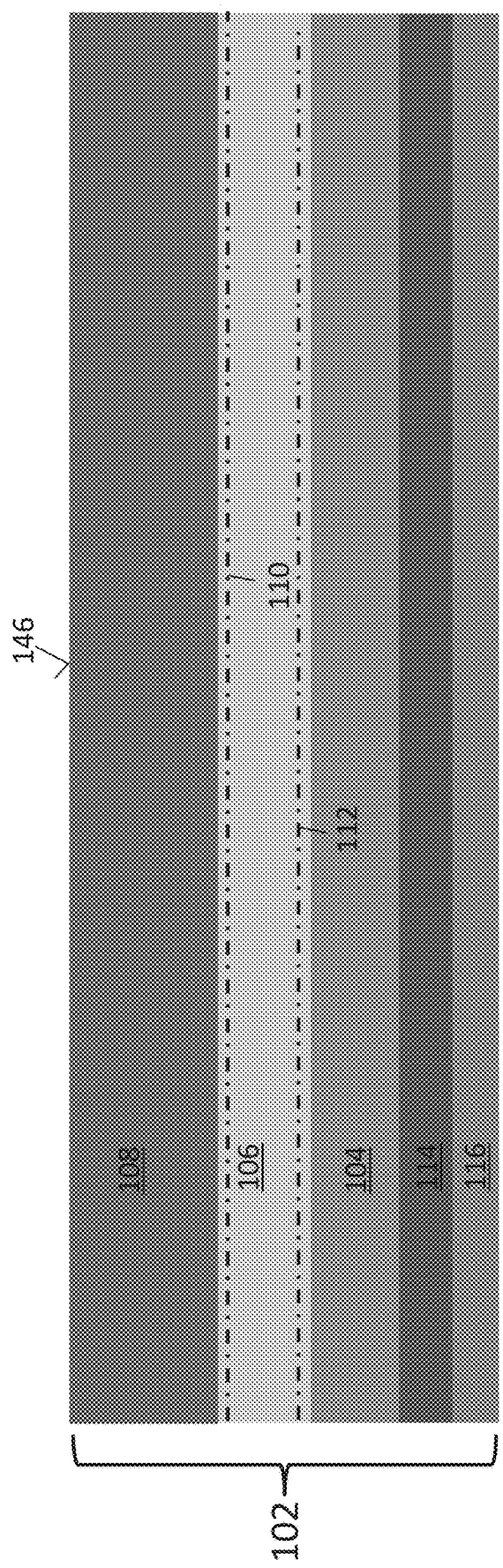
FIG. 3 illustrates providing a heterostructure body, in a method of forming a semiconductor device, according to an embodiment.

Referring to FIG. 3, the heterostructure semiconductor body 102 is provided. According to an embodiment, the heterostructure semiconductor body 102 is formed using an epitaxial growth technique. According to this process, the base substrate 116 is initially provided. The base substrate 116 can be provided from a commercially available bulk semiconductor wafer (e.g., a silicon wafer) or alternatively can be provided from epitaxially grown material. After providing the base substrate 116, a nucleation layer (not shown) can be formed on the base substrate 116. The nucleation layer can be a thin layer of material that is conducive to the growth of type III-V semiconductor thereon. An example of such a material is AlN (aluminum nitride). Exemplary thickness values for the nucleation layer can be in the range of 100-200 nm. After forming the nucleation layer, the transition region 114, the back-barrier region 104, the channel layer 106, and the barrier layer 108 can each be formed successively using epitaxial deposition techniques. The metallic content and/or doping concentration of each of these layers can be controlled during the epitaxial deposition of these layers to achieve the values previously described. Additional doping steps may be performed after the completion of any one of the transition region 114, the back-barrier region 104, the channel layer 106, and the barrier layer 108.

Figure 4:
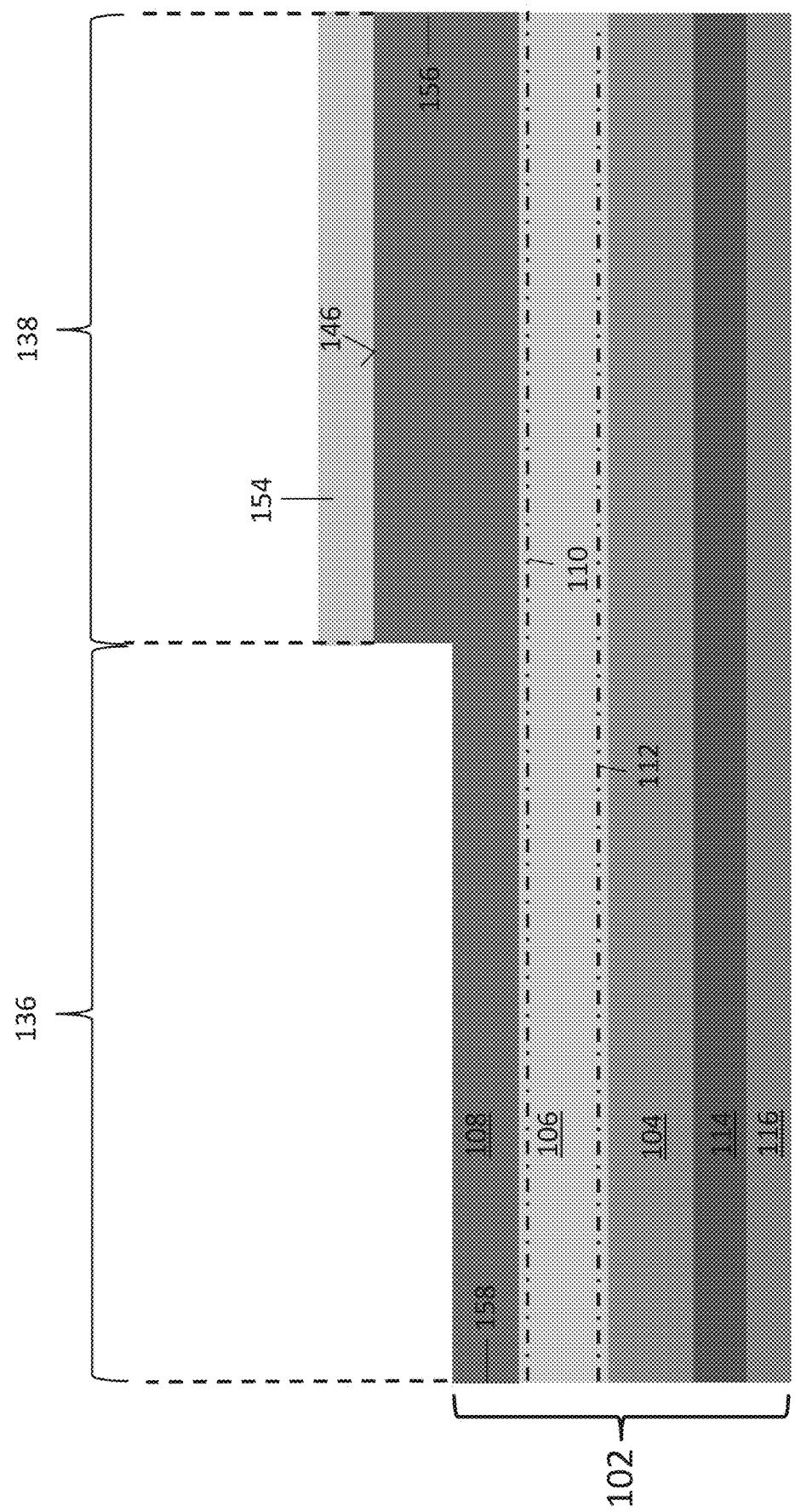
FIG. 4 illustrates processing the heterostructure body to form a dual thickness barrier layer, in a method of forming a semiconductor device, according to an embodiment.

Referring to FIG. 4, the heterostructure semiconductor body 102 has been processed to form the thinner and thicker sections 136, 138 of the barrier layer 108. According to an exemplary technique, the heterostructure semiconductor body 102 is initially provided according to the above described techniques such that the barrier layer 108 has a first substantially uniform thickness across an entire lateral span of the heterostructure semiconductor body 102. The first thickness can be anywhere between 20 and 50 nanometers, for example. Subsequently, a first mask 154 is formed on the upper surface 146 of the barrier layer 108. The first mask 154 is patterned (e.g., using known photolithography techniques) in the desired geometry of the thicker section 138. That is, the first mask 154 is formed to cover the desired area of the thicker section 138 and expose the desired area of the thinner section 136. In one example, the first mask 154 covers one side of the heterostructure semiconductor body 102 up to a first lateral edge 156, and exposes another side of the of the heterostructure semiconductor body 102 up to a second, opposite facing lateral edge 158. The material of the first mask 154 is configured to permit etching of the barrier layer 108 selective to the mask. Exemplary materials for the first mask 154 include silicon nitride (SiN), silicon dioxide ($SiO_2$), and silicon oxynitride ($SiO_xN_y$), or more generally any of a variety of photoresist materials to name a few.

After the patterning of the first mask 154, an etching process is performed to remove semiconductor material from the portion of the barrier layer 108 that is exposed form the first mask 154. According to an embodiment, an anisotropic etching process, such as an anisotropic wet chemical etch process, is used to remove semiconductor material. The etching process is carried out such that the exposed portion of the barrier layer 108 has a second thickness that is less than the first thickness. The second thickness can be less than about 20 nanometers, less than about 10 nanometers, or less than less than about 5 nanometers, for example.

Instead of the above described technique, the barrier layer 108 can be processed to form the thinner and thicker sections 136, 138 using an opposite technique (not shown). According to this technique, the barrier layer 108 is initially formed have the second thickness (e.g., between 5 and 10 nm). Subsequently, a mask is formed on the upper surface 146 of the barrier layer 108 and patterned to cover the desired area of the thinner section 136. The mask is formed from an epitaxial growth inhibiting material such as silicon dioxide ($SiO_2$), for example. Subsequently, an epitaxial deposition process is performed whereby the same material as the barrier layer 108 (e.g., AlGaN) is formed on the unmasked portion of the barrier layer 108. This epitaxial deposition process is performed until the unmasked portion of the barrier layer 108 has the first thickness.

Figure 5:
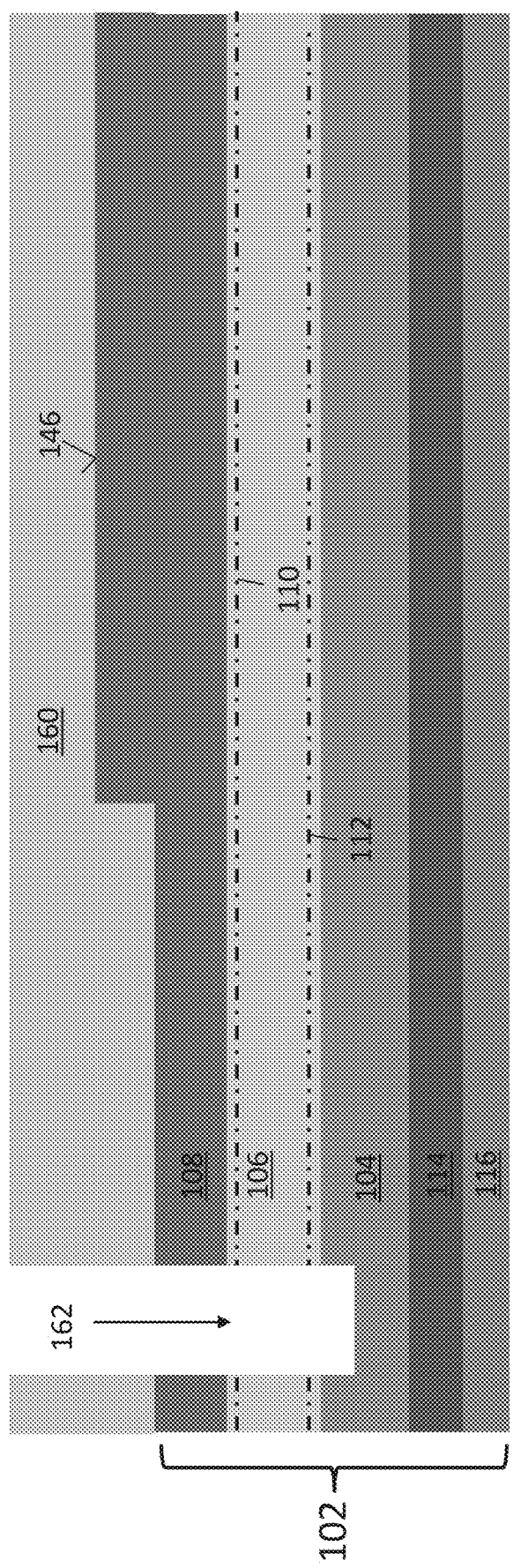
FIG. 5 illustrates forming a trench for a deep contact structure in the heterostructure body, in a method of forming a semiconductor device, according to an embodiment.

Referring to FIG. 5, after the barrier layer 108 has been processed to form the thinner and thicker sections 136, 138, a second mask 160 is formed on the upper surface 146 of the barrier layer 108. Exemplary materials for the second mask 160 include silicon nitride (SiN), silicon dioxide ($SiO_2$), and silicon oxynitride ($SiO_xN_y$), to name a few. The second mask 160 is patterned in the desired geometry of the deep contact structure 131. That is, an opening is formed in the second mask 160 that corresponds to a location of the deep contact structure 131. After the patterning of the second mask 160, an etching process is performed to remove semiconductor material from portions the barrier and channel layers 108, 106 that are exposed by the second mask 160. The etching process is carried out until a contact trench 162 reaches the third type III-V semiconductor layer 110.

Figure 6:
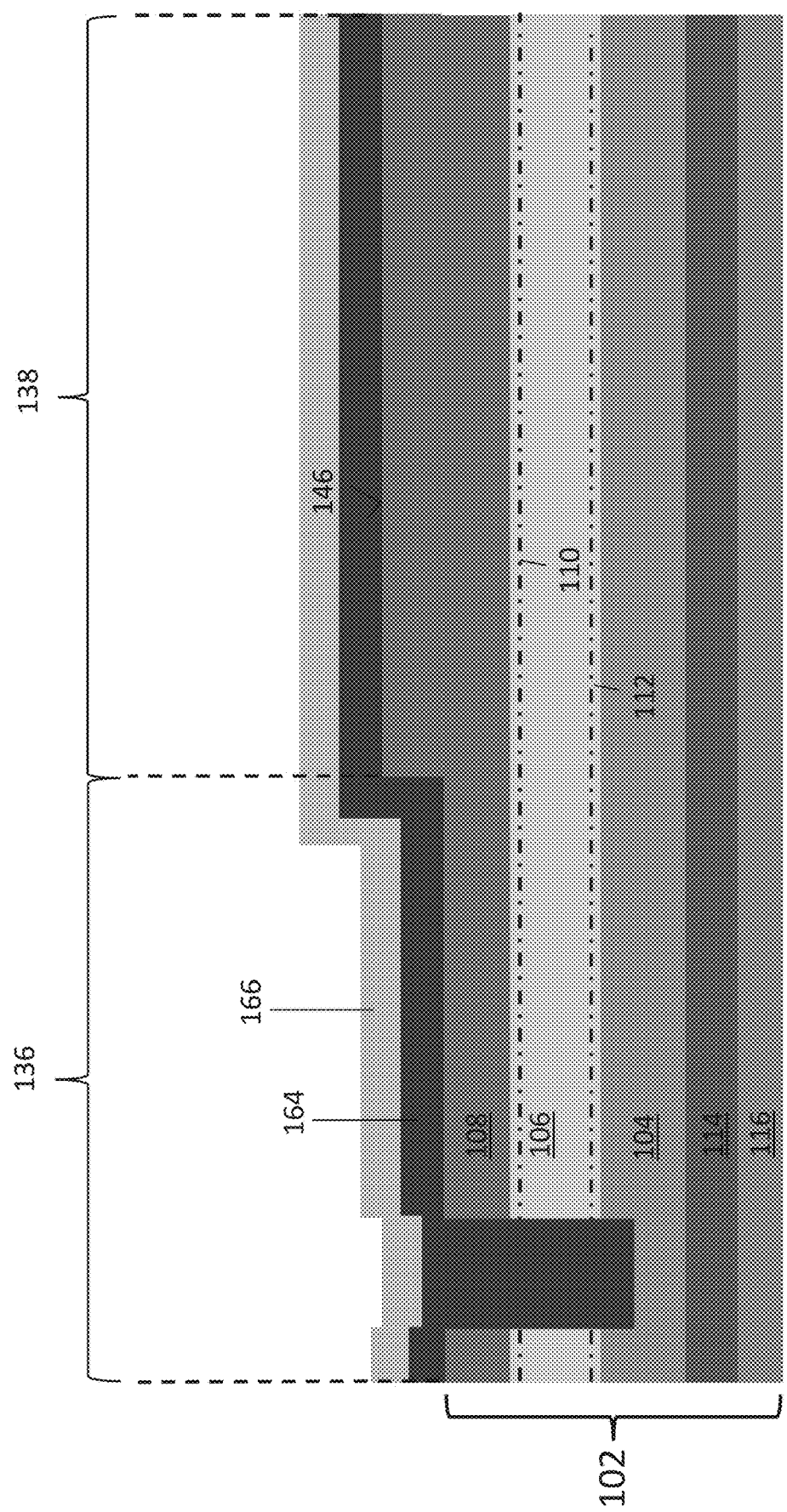
FIG. 6 illustrates forming a doped semiconductor layer and a metal layer on the heterostructure body, in a method of forming a semiconductor device, according to an embodiment.

Referring to FIG. 6, after the contact trench 162 has been formed and the second mask 160 has been removed, a multi-layer deposition process is performed. According to this process, a first layer of doped semiconductor material 164 is formed on the exposed surfaces of the heterostructure semiconductor body 102. This can be done using an epitaxial growth process. The first layer of doped semiconductor material 164 has the opposite doping type as the majority carriers of the first two-dimensional charge carrier gas 110 and the same doping type as the majority carriers of the second two-dimensional charge carrier gas 112. For example, in the case of the AlGaN/GaN/AlGaN heterostructure semiconductor body 102 as previously described, the first layer of doped semiconductor material 164 includes p-type GaN. The first layer of doped semiconductor material 164 may have a total (net) doping concentration of about $1e^{19}/cm^3$ with a concentration of first conductivity type (e.g., p-type) dopants in the range of $1e^{19}/cm^3$ of about $1e^{17}/cm^3$.

The first layer of doped semiconductor material 164 is grown such that it completely fills the contact trench 162 and covers the upper surface 146 of the barrier layer 108, including the thinner section 136, the thicker section 138, and the transition 142. After forming the first layer of doped semiconductor material 164, a first conductive layer 166 is formed on top of the first layer of doped semiconductor material 164. This can be done using a deposition technique, such as electroless deposition or electroplating. The material of the first conductive layer 166 corresponds to the material of the first, second and third conductive regions 134, 126, and 152 as previously described, i.e., aluminum, nickel, copper, titanium, etc., metal nitrides. e.g., AlN, TiN, etc., and alloys thereof.

Figure 7:
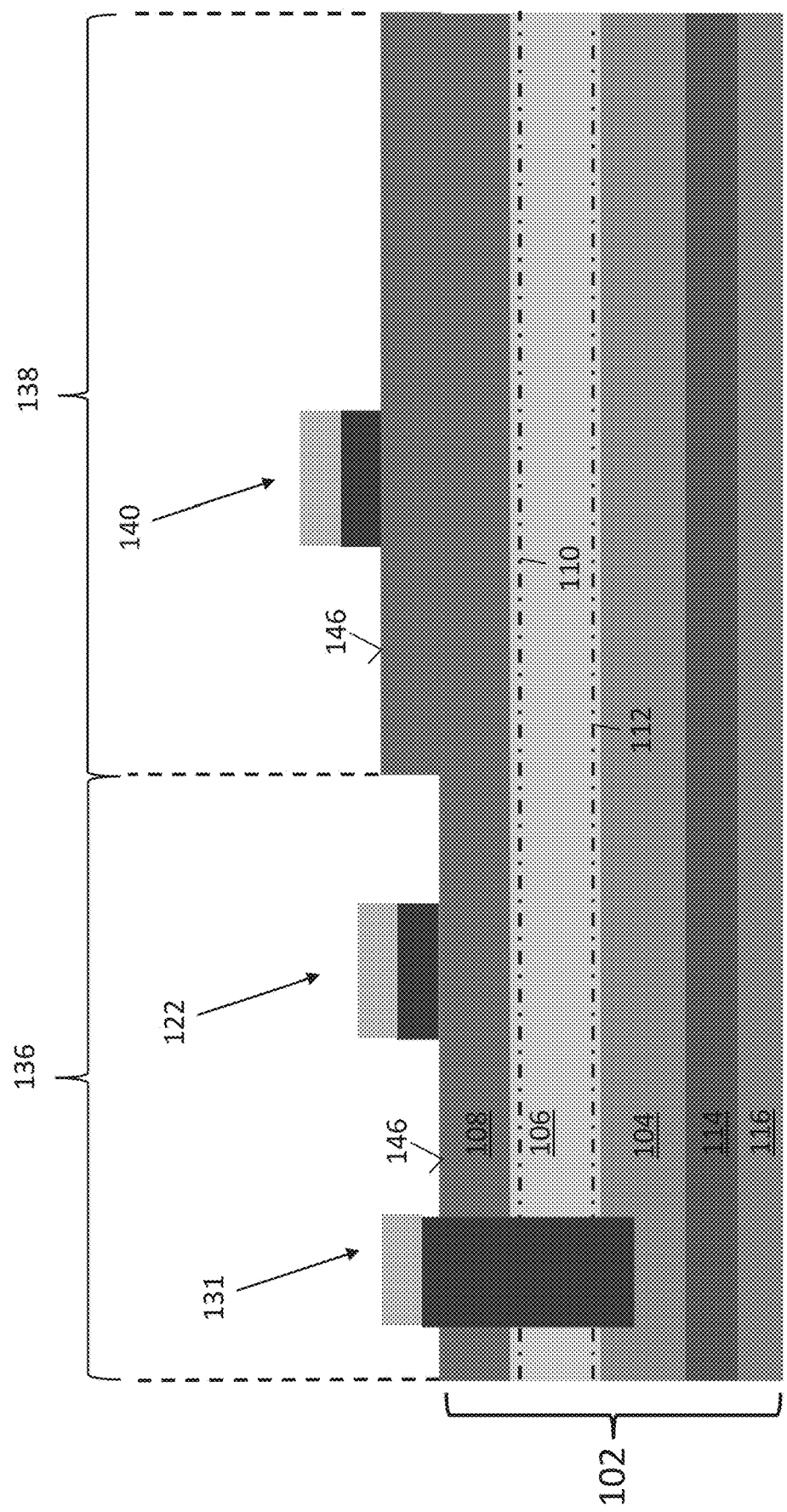
FIG. 7 illustrates structuring the doped semiconductor layer and the metal layer to form electrode structures, in a method of forming a semiconductor device, according to an embodiment.

Referring to FIG. 7, a common lithography step is performed to structure the first layer of doped semiconductor material 164 and the first conductive layer 166 into discrete regions. According to this technique, a third mask (not shown) is formed over the first conductive layer 166 and patterned in the desired geometry of the gate structure 122, the drain biasing structure 140, and the deep contact structure 131. Subsequently, an etching process is carried out whereby portions of the first layer of doped semiconductor material 164 and the first conductive layer 166 that are exposed from the third mask are etched away. This etching process can be a multi-step process whereby a different etchant chemical is used to remove the first layer of doped semiconductor material 164 and the first conductive layer 166. As a result, the upper surface 146 of the barrier layer 108 between the gate structure 122, the drain biasing structure 140 and the deep contact structure 131 is exposed.

Figure 8:
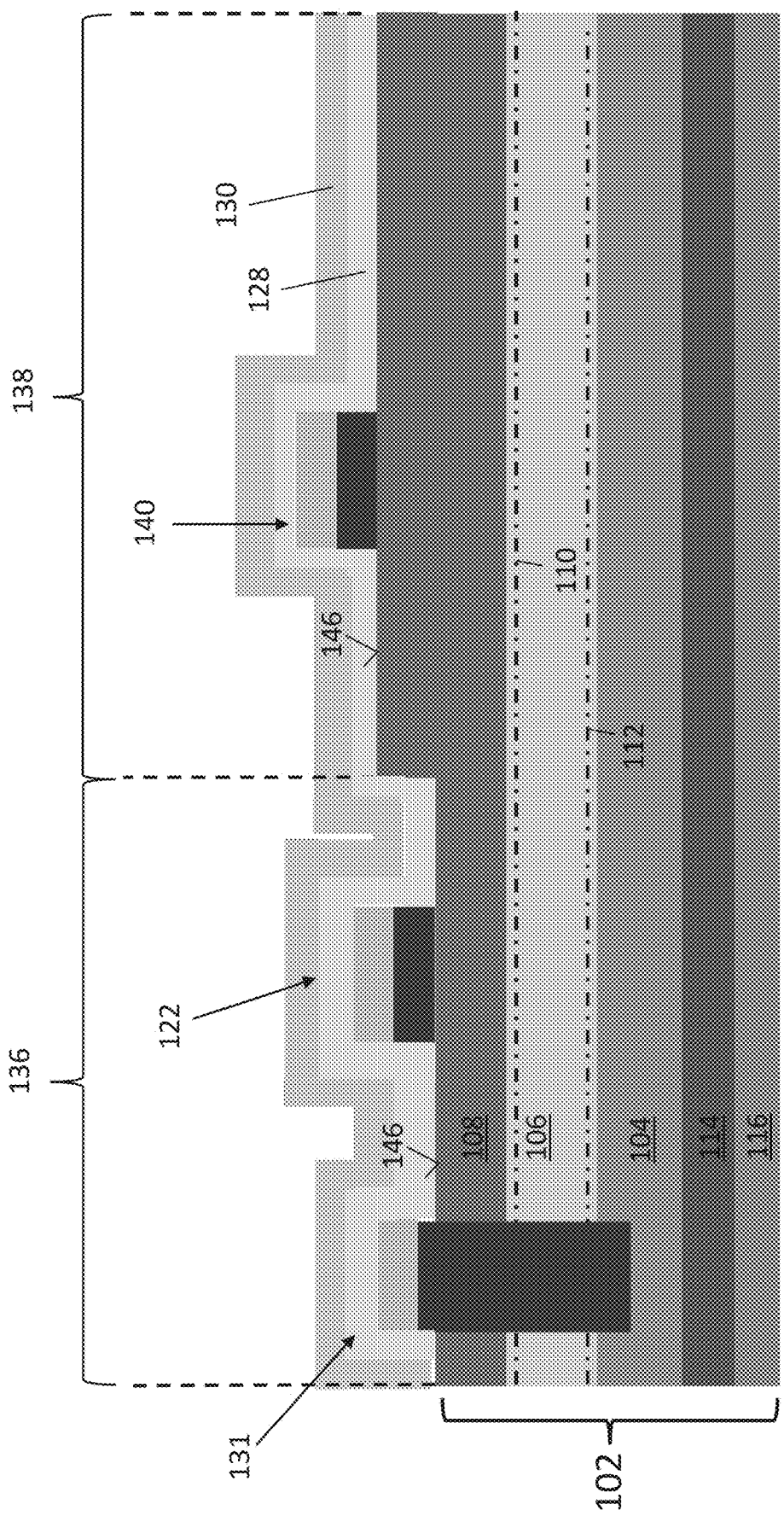
FIG. 8 illustrates forming first and second passivation layers on the structured regions, in a method of forming a semiconductor device, according to an embodiment.

Referring to FIG. 8, after structuring the first layer of doped semiconductor material 164 and the first conductive layer 166, the first and second passivation layers 128, 130 are formed. This can be done using a deposition technique, such as chemical vapor deposition (CVD), for example. The first and second passivation layers 128, 130 are conformally deposited so as to cover the gate structure 122, the drain biasing structure 140 and the deep contact structure 131 as well as the exposed upper surface 146 of the barrier layer 108 in between these structures.

Figure 9:
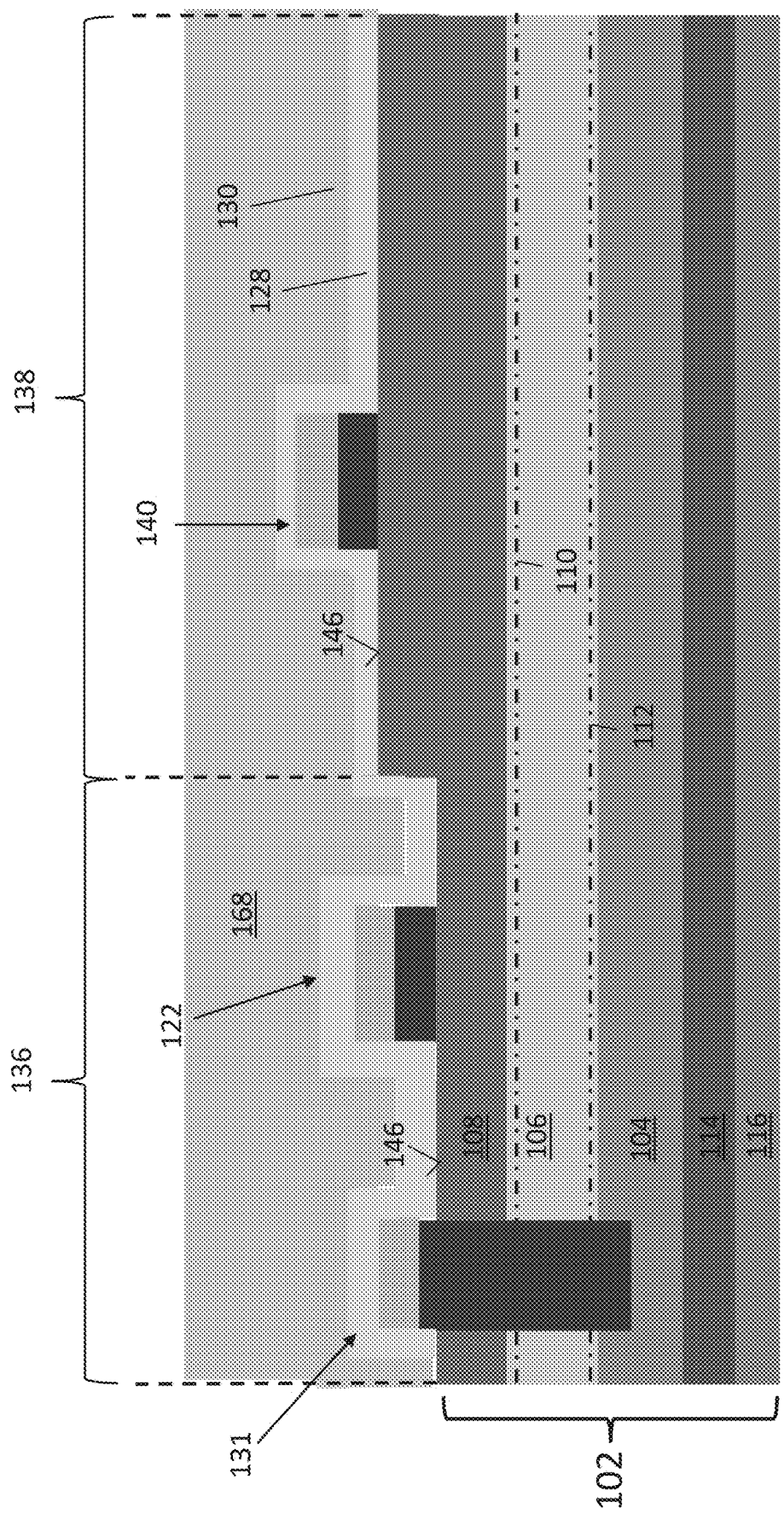
FIG. 9 illustrates forming a mask over the first and second passivation layers, in a method of forming a semiconductor device, according to an embodiment.

Referring to FIG. 9, after forming the first and second passivation layers 128, 130, a third mask 168 is formed over the second passivation layer. The third mask 168 includes an etch-resistant material. Exemplary materials for the third mask 168 include silicon dioxide.

Figure 10:
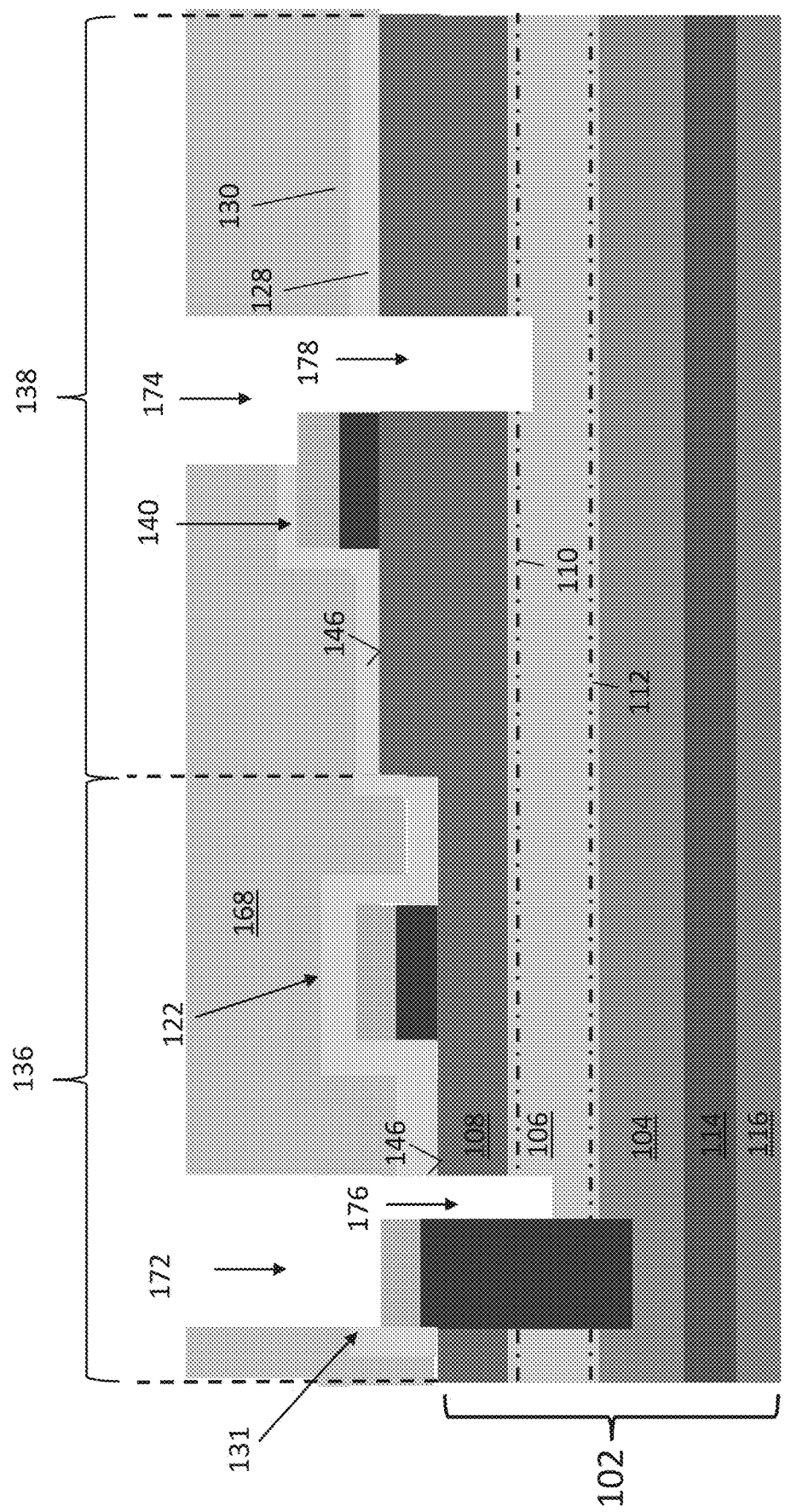
FIG. 10 illustrates forming contact trenches in the heterostructure body, in a method of forming a semiconductor device, according to an embodiment.

Referring to FIG. 10, the third mask 168 is patterned to include first and second openings 170, 172. The first opening 170 is formed directly over the deep contact structure 131. The second opening 172 is formed to partially overlap with the drain biasing structure 140 so as to expose a portion of the drain biasing structure 140 and a portion of the heterostructure semiconductor body 102 that is immediately adjacent to the drain biasing structure 140. After patterning the third mask 168, an etching process is performed so as to remove passivation material and semiconductor material, selective to the material of the first conductive layer 166. As a result, a first trench 176 is formed in the heterostructure semiconductor body 102 immediately adjacent to the deep contact structure 131, and a second trench 178 is formed in the heterostructure semiconductor body 102 immediately adjacent to the drain biasing structure 140. The etching process can be carried out such that the first and second trenches 176, 178 reach the first two-dimensional charge carrier gas 108. According to other embodiments, no etching of the semiconductor material is necessary, and only etching of the passivation layers is required to form ohmic contacts with the first two-dimensional charge carrier gas 108.

Figure 11:
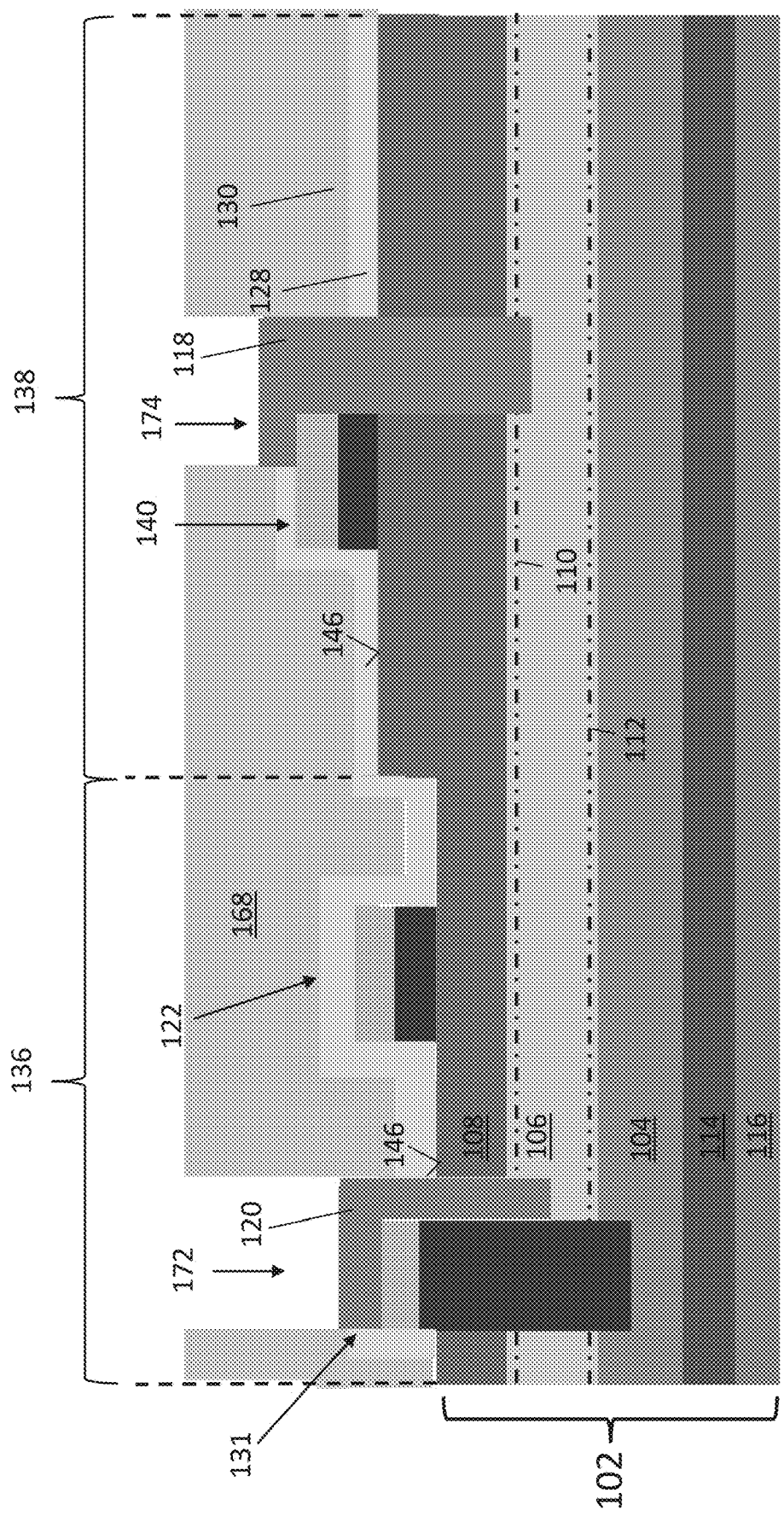
FIG. 11 illustrates forming input-output electrodes, in a method of forming a semiconductor device, according to an embodiment.

Referring to FIG. 11, an electrically conductive material, e.g., aluminum, copper, polysilicon, etc., is deposited in the first and second trenches 176, 178. This can be done using any of a variety of deposition techniques. including electroplating, electroless deposition, and epitaxy, to name a few. As a result, the first and second input-output electrodes 118, 120, as well as the interconnect structures that connect the first and second input-output electrodes 118, 120 to the drain biasing structure 140 and the deep contact structure 131, respectively, are formed.

The technique described with reference to FIGS. 3-11 illustrate an example for forming the semiconductor device 100 described with reference to FIG. 2 that includes both the deep contract structure 130 and the drain biasing structure 140. A corresponding semiconductor device 100 that does not include either one or both of these structures can be formed by omitting the relevant steps (e.g., the contact trench 162 etch of FIG. 5) and/or by appropriately performing the lithography steps (e.g., the mask deposition and etching steps described with reference to FIG. 7) to omit these structures.

Figure 12:
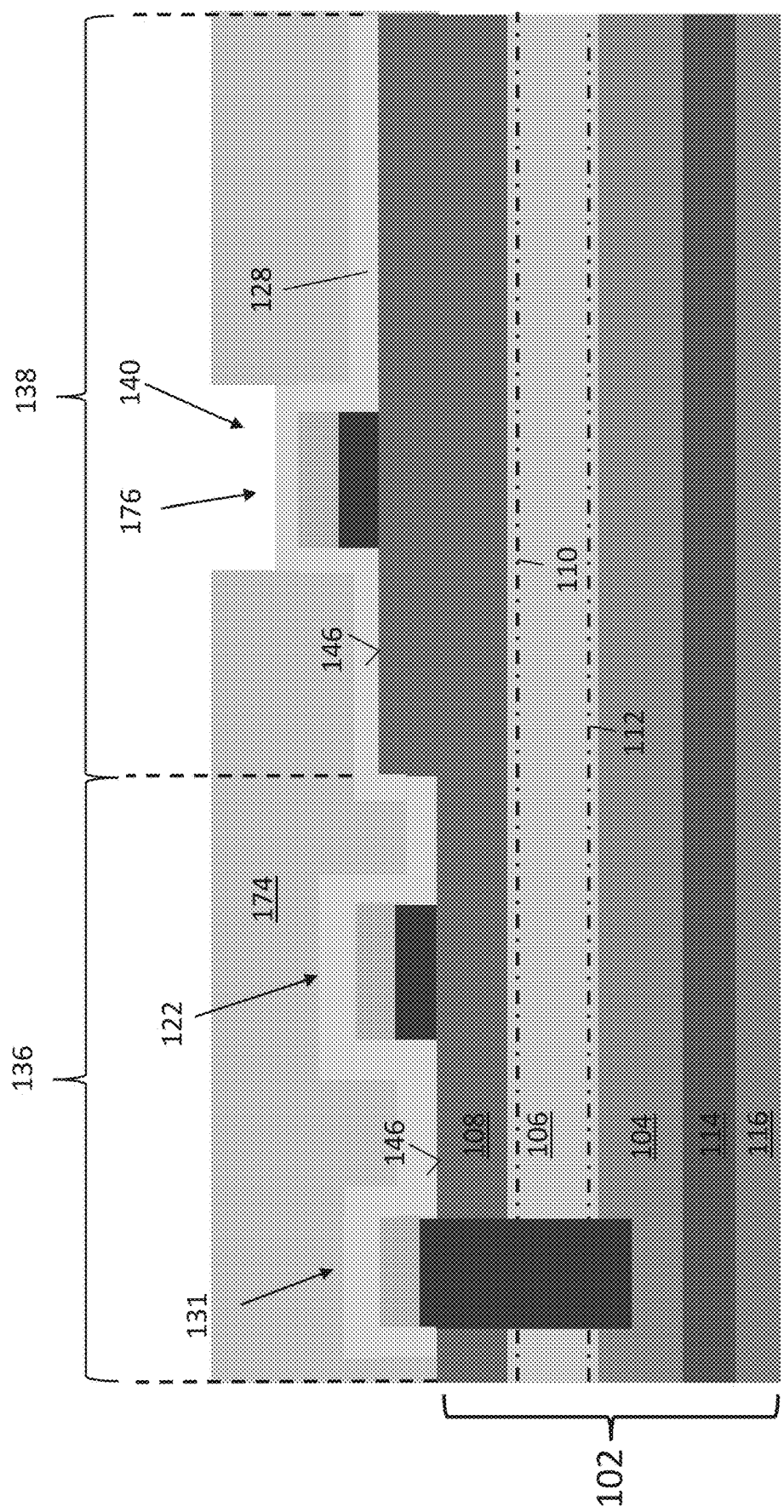
FIG. 12 illustrates forming a mask over the first passivation layer, in an alternate method for forming a semiconductor device, according to an embodiment.
Figure 13:
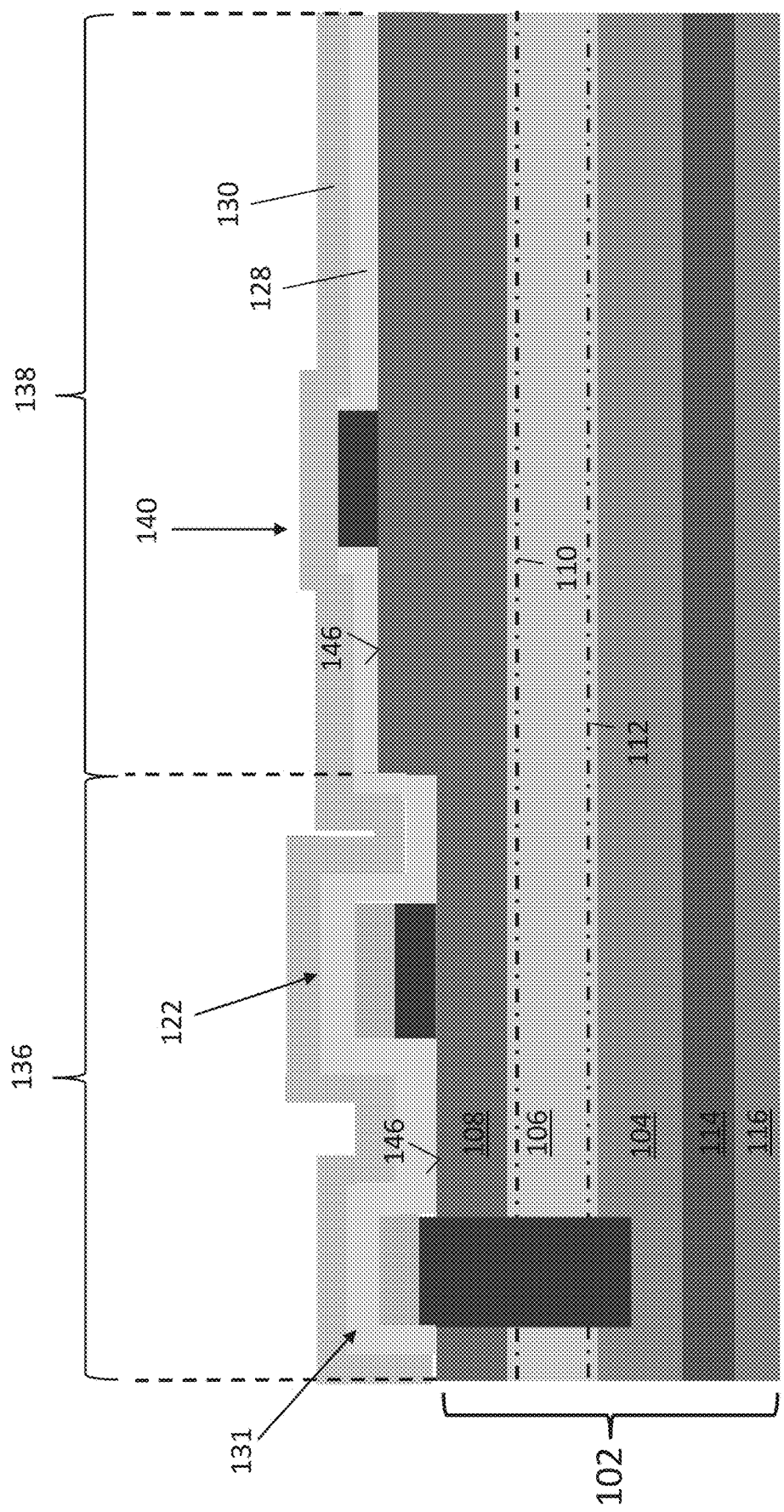
FIG. 13 illustrates forming the second passivation layer after removing the metal electrode from the drain biasing structure, in a method for forming a semiconductor device, according to another embodiment.

Referring to FIGS. 12-13, selected method steps for forming the semiconductor device 100 are shown, according to another embodiment. In this embodiment, a different sequence is performed so that the drain biasing structure 140 does not include a metal electrode.

Referring to FIG. 12, a heterostructure semiconductor body 102 is provided and processed to include the multi-thickness barrier layer 108, the gate structure 122, the deep contact structure 131 and the drain biasing structure 140. This may be done according to the techniques previously described with reference to FIGS. 3-7. Subsequently, the first passivation layer 128 is formed in the manner described with reference to FIG. 8, for example. Different to the previously described method, before forming the second passivation layer 130 on the first passivation layer 128 as shown in FIG. 8, a fourth mask 174 is formed directly on the first passivation layer 128. The fourth mask 174 is patterned to include a third opening 176 that is directly over the drain biasing structure 140. The formation and patterning of the fourth mask 174 can be done using the previously described techniques. Subsequently, the exposed portion of the first passivation layer 128 and the subjacent conductive material of the first conductive layer 166 that is formed on the third doped semiconductor region 150 us removed using an etching technique. This can be done using the previously described etching techniques.

Referring to FIG. 13, after removing the exposed portion of the first passivation layer 128 and the subjacent conductive material of the first conductive layer 166 that is formed on the third doped semiconductor region 150, the second passivation layer 130 is deposited on top of the first passivation layer 128. The second passivation layer can be formed according to the previously described techniques, and in particular those techniques described with reference to FIG. 8.

Figure 14:
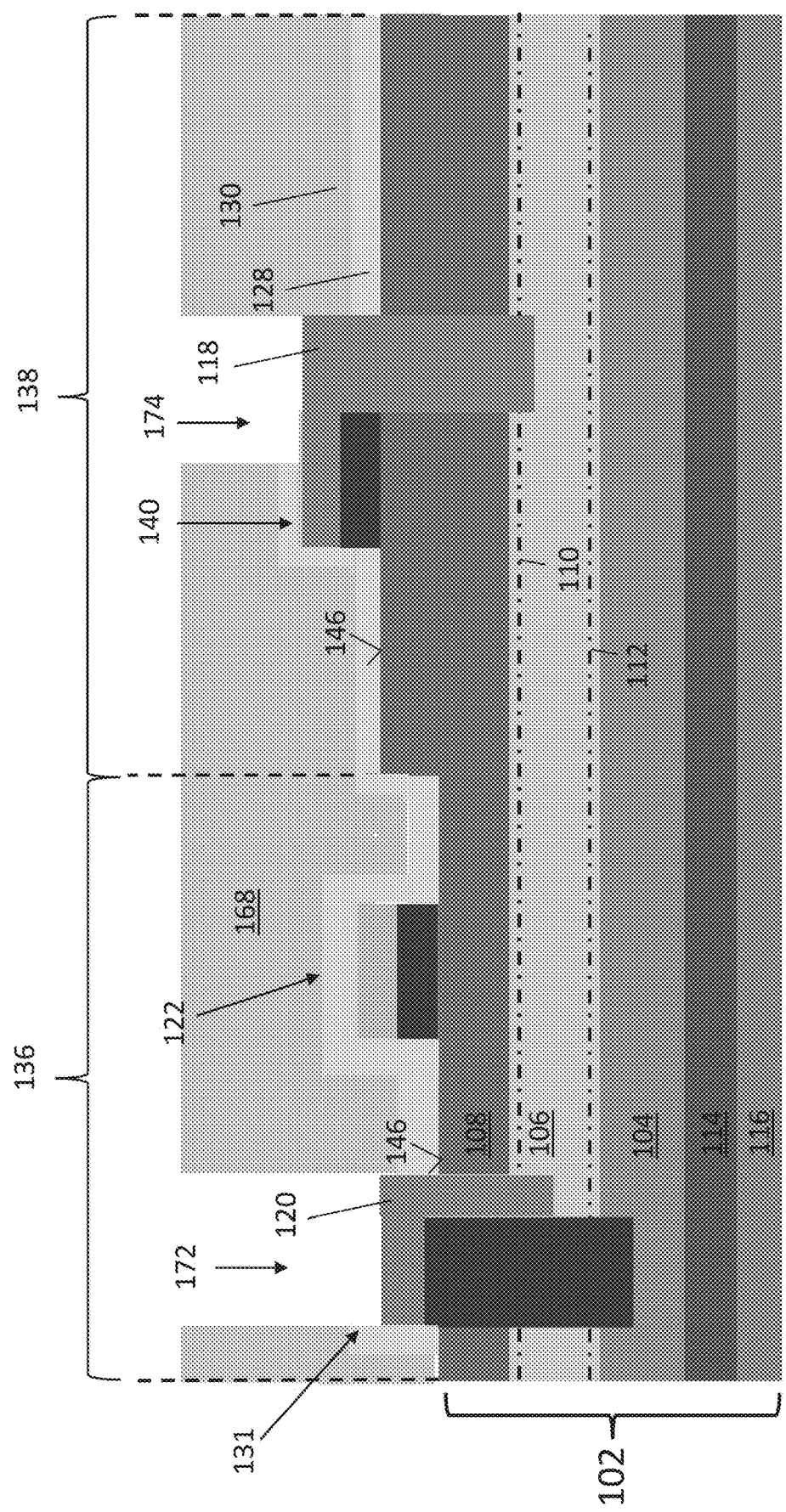
FIG. 14 illustrates forming input-output electrodes for the semiconductor device, in a method for forming a semiconductor device, according to another embodiment.

Referring to FIG. 14, after the first and second passivation layers 128, 130 are patterned to include the first and second openings 172, 174, the first and second trenches 176, 178 are formed in the heterostructure semiconductor body 102. This can be done using the masked etching techniques previously described with reference to FIG. 9-10. According to this process. the p-type material on top of the deep contact structure 131 can be removed. Subsequently, an electrically conductive material, e.g., aluminum, copper, polysilicon, etc., is deposited in the first and second openings 172, 174. As a result, the first and second input-output electrodes 118, 120, as well as the interconnect structures that connect the first and second input-output electrodes 118, 120 to the drain biasing structure 140 and the deep contact structure 131, respectively, are formed.

The above described processing steps advantageously provide a reliable and cost-effective method for forming the semiconductor device 100. In particular, one advantage is reduced process complexity by forming several of the device features together using common lithography steps. In particular, as described with reference to FIGS. 6-7 the deep contact structure 131 the gate structure 122 and the drain biasing structure 140 are formed by a common process whereby a single layer of doped type III-V semiconductor material and a single layer of conductive material is used to form the semiconductor and metal regions for each of these structures, respectively, and a single mask is used to define each of these features.

Another advantage of the above described processing steps is a high degree of controllability and precision over the electrical properties of the semiconductor device 100. As previously discussed, the thickness of the barrier layer 108 in the thinner and thicker regions plays a significant role in the parameters of the device. There is a tradeoff between reliability and $R_{DSON}$ that is determined by the ratio of the lateral separation distance from the gate structure 122 to the transition 142 and the lateral separation distance from the gate structure 122 to the first-input output contact 118. For example, for improved $R_{DSON}$, the designer can form the device such that the gate structure 122 is very close to the transition 142 thereby increasing the ratio between the amount of the drift path that includes the thicker barrier layer 108 and the amount of the drift path that includes the thinner barrier layer 108. However, this comes at the expense of reliability, as the closer transition increases the supply of carriers at the gate-drain edge. Thus, the designer can select a tradeoff that is best suited for application needs by appropriately tailoring the distance between the gate structure 122 and the transition 122. In one example of this technique, the semiconductor device 100 is optimized with respect to a ratio of the distance from the gate structure 122 to the transition 142 and the distance from the gate structure 122 to the first input-output electrode 118 (e.g., the drain electrode), In various embodiments, this ratio can range between 0.25 and 0.5 for optimal performance. This ratio depends upon, among other things, the maximum voltage rating of the device. The distance from the gate structure 122 to the first input-output electrode 118 can be in the range of 2-3 microns for a 100V rated transistor and in the range of 10-11 microns for a 500V rated transistor. Because the geometry of the thicker and thinner sections 136, 138 is easily controlled by the masked etching steps described with reference to FIGS. 4-5, different ratios can be selected with a high degree of precision using a relatively inexpensive process.

In the above described embodiments, the transition region 114, the back-barrier region 104, the channel layer 106, and the barrier layer 108 are described as being regions of AlGaN, AlGaN, AlGaN, and AlGaN, respectively. These materials are used for illustrative purposes only. More generally, any of a variety of combinations of III-V semiconductor materials can be used to provide the device concept described herein. Examples of these III-V semiconductor materials for these regions include any III-nitride based compound semiconductor material. For example, GaN may be combined with AlGaN or InGaN to form an electron gas inversion region as the channel. The compound semiconductor device 100 may have AlInN/AlN/GaN barrier/spacer/first type III-V semiconductor layer 104 structures. In general, the normally-off compound semiconductor transistor can be realized using any suitable III-nitride technology such as GaN that permits the formation of opposite polarity inversion regions due to piezoelectric effects. In a broad sense, the compound semiconductor transistors described herein can be formed from any binary, ternary or quaternary III-nitride compound semiconductor material where piezoelectric effects are responsible for the device concept.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together, e.g. a connection via a metal and/or highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a heterojunction semiconductor body, the heterojunction semiconductor body comprising a first type III-V semiconductor layer and a second type III-V semiconductor layer formed over the first type III-V semiconductor layer, the second type III-V semiconductor layer having a different bandgap as the first type III-V semiconductor layer such that a first two-dimensional charge carrier gas forms at an interface between the first and second type III-V semiconductor layers.
   wherein the second type III-V semiconductor layer comprises a thicker section and a thinner section,
   a first input-output electrode on the thicker section of the second type III-V semiconductor layer, the first input-output electrode being in ohmic contact with the first two-dimensional charge carrier gas, and
   a second input-output electrode on the thinner section of the second type III-V semiconductor layer, the second input-output electrode being in ohmic contact with the first two-dimensional charge carrier gas; and
   a gate structure formed on the thinner section of the second type III-V semiconductor layer, the gate structure being configured to control a conductive connection between the first and second input-output electrodes,
   wherein the gate structure is laterally spaced apart from a transition between the thicker and thinner sections of the second type III-V semiconductor layer.

2. The semiconductor device of claim 1, wherein the gate structure is disposed completely above a first planar upper surface of the second type III-V semiconductor layer, the first planar upper surface extending out from underneath the gate structure at either side of the gate structure.

3. The semiconductor device of claim 1, wherein the thinner section has a first substantially uniform thickness along a first lateral region extending from the second input-output electrode to the transition, and wherein the thicker section has a second substantially uniform thickness along a second lateral region extending from the transition to the second input-output electrode.

4. The semiconductor device of claim 1, further comprising:
   a drain biasing structure formed on the thicker section of the second type III-V semiconductor layer, the drain biasing structure comprising a second doped type III-V semiconductor region on the upper surface of the second type III-V semiconductor layer;
   a first passivation layer that conforms to the upper surface of the second type III-V semiconductor layer in the thinner section, the thicker section, and the transition between the thicker and thinner sections;
   a second passivation layer disposed on the first passivation layer and disposed over the thinner section, the thicker section, and the transition between the thicker and thinner sections;
   a second opening in the second passivation layer that exposes the upper side of the second doped type III-V semiconductor region; and
   an electrically conductive interconnect structure formed in the second opening and electrically connecting the second doped type III-V semiconductor region with the second input-output electrode.

5. The semiconductor device of claim 1, wherein the second input-output electrode is formed on the thinner section of the second type III-V semiconductor layer.

6. The semiconductor device of claim 1, wherein the heterojunction semiconductor body further comprises a second two-dimensional charge carrier gas disposed beneath the first two-dimensional charge carrier gas, the second two-dimensional charge carrier gas having an opposite majority carrier type as the first two-dimensional charge carrier gas, and wherein the semiconductor device further comprises a deep contact structure that forms an electrically conductive connection between the second two-dimensional charge carrier gas and the second input-output electrode.

7. The semiconductor device of claim 1, wherein the thinner section of the second type III-V semiconductor layer comprises a first planar upper surface that extends along a single plane and reaches the transition, the first planar upper surface being opposite from a lower surface of the second type III-V semiconductor layer that faces the first type III-V semiconductor layer, wherein the gate structure and the second input-output electrode are formed on the first planar upper surface, wherein the gate structure comprises a first doped type III-V semiconductor region that is formed on the first planar upper surface and an electrically conductive gate electrode that is formed on the first doped type III-V semiconductor region, wherein a complete lower side of the first doped type III-V semiconductor region faces and is coplanar with the first planar upper surface, and wherein material properties of the first doped III-V semiconductor region locally deplete the first two-dimensional charge carrier gas in the absence of external bias such that the semiconductor device is normally-off.

* * * * *

UNITED STATES PATENT AND TRADEMARK OFFICE
CERTIFICATE OF CORRECTION

PATENT NO. : 10,840,353 B2
APPLICATION NO. : 16/714868
DATED : November 17, 2020
INVENTOR(S) : Curatola et al.

Page 1 of 1

It is certified that error appears in the above-identified patent and that said Letters Patent is hereby corrected as shown below:

On the Title Page

Item (57), abstract (Line 2), please change "a first" to -- first --.

In the Claims

Column 15, Line 40 (Claim 1, Line 10), please change "layers." to -- layers, --.

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*